United States Patent [19]

Michaloski

[11] Patent Number: 5,461,456
[45] Date of Patent: Oct. 24, 1995

[54] SPATIAL UNIFORMITY VARIER FOR MICROLITHOGRAPHIC ILLUMINATOR

[75] Inventor: Paul F. Michaloski, Rochester, N.Y.

[73] Assignee: General Signal Corporation, Stamford, Conn.

[21] Appl. No.: 395,171

[22] Filed: Feb. 27, 1995

Related U.S. Application Data

[63] Continuation of Ser. No. 981,186, Nov. 24, 1992, abandoned.

[51] Int. Cl.⁶ .................................................. G03B 27/54
[52] U.S. Cl. .................... 355/67; 355/53; 355/70; 355/71
[58] Field of Search ................... 355/67, 70, 71, 355/53, 77

[56] References Cited

U.S. PATENT DOCUMENTS

| | | | |
|---|---|---|---|
| 4,229,097 | 10/1980 | Vulmiere et al. | 355/71 |
| 4,851,882 | 7/1989 | Takahashi et al. | 355/67 |
| 4,988,188 | 1/1991 | Ohta | 355/67 |
| 5,014,086 | 5/1991 | Barry | 355/71 |
| 5,113,244 | 5/1992 | Curran . | |
| 5,245,384 | 9/1993 | Mori . | |

Primary Examiner—Monroe H. Hayes
Attorney, Agent, or Firm—Eugene Stephens & Associates

[57] ABSTRACT

A microlithographic projection imager has an illuminator system that is adjustable for the uniformity of spatial intensity of the illumination delivered to the wafer plane. This uniformity adjustment can compensate for factors tending to deviate the illumination from uniformity. The uniformity adjusting member is preferably refractive and axially movable next to a pupil of the illuminator.

26 Claims, 3 Drawing Sheets

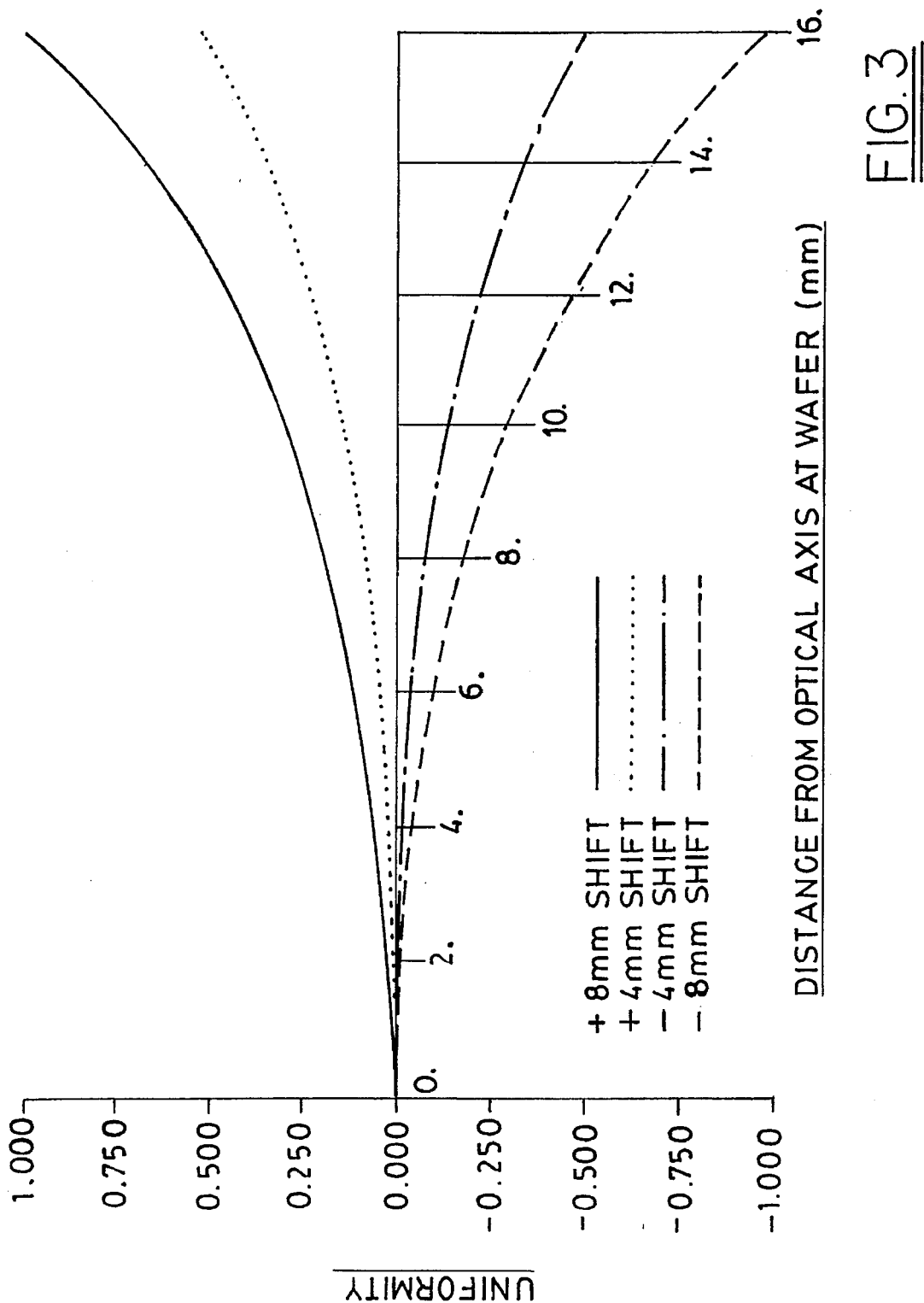

SPATIAL UNIFORMITY VARIER FOR MICROLITHOGRAPHIC ILLUMINATOR

RELATED APPLICATIONS

This application is a continuation of parent application No. 07/981,186, filed Nov. 24, 1992, entitled SPATIAL UNIFORMITY VARIER FOR MICROLITHOGRAPHIC ILLUMINATOR, and abandoned upon the filing of this continuation application.

TECHNICAL FIELD

This invention involves the uniformity of the spatial intensity of illumination provided for a microlithographic projection imager.

BACKGROUND

Illuminators for microlithographic projection imagers are generally designed to provide illumination having uniform spatial intensity so that all areas of the field are equally illuminated, especially at a wafer plane where the illumination is incident on a wafer. The uniformity of the spatial intensity of the illumination used has been achieved by painstaking optical design of a number of components guiding illumination from a source to an objective imaging system. Once the illuminator portion of the imager has been designed to assure uniformity of the illumination, then this aspect of the illumination has not been adjustable during the operating life of the equipment.

Experience with such illuminators has revealed several factors that affect or vary the uniformity of the spatial intensity of the illumination, and these factors cause illumination departures from uniformity that can be sufficient to diminish the quality of the microlithographic products made by projection imagers. This led to a recognition of the desirability of improving on the uniformity of the illumination reaching the wafer plane; and in response to this need, I have devised a simple and effective way of varying the spatial intensity of the illumination provided by an illumination system. Making the spatial intensity of the illumination variable in uniformity then allows the illumination system to compensate for factors causing departure from uniformity so that in spite of these factors, illumination can be made uniform in spatial intensity at the wafer plane. In other words, an illumination system allowing uniformity to be varied can change the spatial intensity of the illumination being delivered so that when the illumination reaches the wafer plane, it is uniform in spatial intensity as desired.

SUMMARY OF THE INVENTION

An illuminator for a microlithographic projection imager, instead of being designed for invariably producing illumination intended to have a uniform spatial intensity, is made variable according to my invention so that the spatial intensity of the illumination can be adjusted. Several factors within the optical systems of the illuminator and the projection imager can affect the uniformity of the spatial intensity of the illumination so that making the uniformity of the illuminator adjustable can compensate for these factors.

A preferred way of adjusting the spatial intensity of the illumination is by moving an optical member of the optical system of the illuminator. This member or component can serve other optical purposes in the illuminator and is preferably a refractive member of the imaging system of the illuminator; and its adjustment, which preferably occurs axially of the illuminator optical system, changes the uniformity of the spatial intensity of the illumination, preferably by varying distortion of the optical system of the illuminator. Adjustment of the uniformity member varying the distortion of the illuminator imaging system can lead to the need for adjusting other members or components of the optical system of the illuminator, to adjust for non-telecentric imaging of the illuminator system at the wafer plane and to restore a predetermined magnification departed from by adjustment of the uniformity member. These adjustments can be made manually or under computer control.

DRAWINGS

FIG. 3 is a graph showing the effect on spatial intensity of illumination caused by adjustment of a uniformity member in the optical system of the illuminator according to the invention.

DETAILED DESCRIPTION

Experience with illumination systems for microlithographic projection imagers has revealed several factors that can vary the spatial intensity of the illumination from the perfect uniformity that is desired at the wafer plane. These include: fabrication and design flaws in the illuminator itself (for example, fabrication flaws in the optics and in optical coatings); changes in the illumination system during use (for example, foreign materials gradually contaminating optical surfaces); and presence of a mask in the reticle plane of the objective imaging system (causing illumination changes from diffraction). Edges of features detailed in such a mask have a diffractive effect that varies with the minuteness and density of the mask features. A mask with closely spaced features that are very small will diffract more of the illumination than a mask with more widely spaced and larger features. For this reason, it becomes desirable to vary the spatial intensity of the illumination to compensate for the type of mask present at the reticle plane so that in spite of the diffraction caused by the mask, the illumination becomes uniform at the wafer plane.

Having an understanding of the factors tending to make illumination deviate from the desired uniformity then leads to the possibility of adjusting uniformity to compensate for such factors. The invention provides a simple and effective way of doing this with an adjustment that can be made to compensate by varying the spatial intensity of the illumination in an opposite sense from the uniformity departure caused by other factors. Uniformity of the spatial intensity of the illumination then becomes adjustable to meet changing circumstances, rather than being fixed invariably into the design of the optical system of the illuminator. This allows uniformity to be determined and compensated for and makes the illumination system more precisely compatible with the rest of the microlithographic projection imager.

Figure 1:
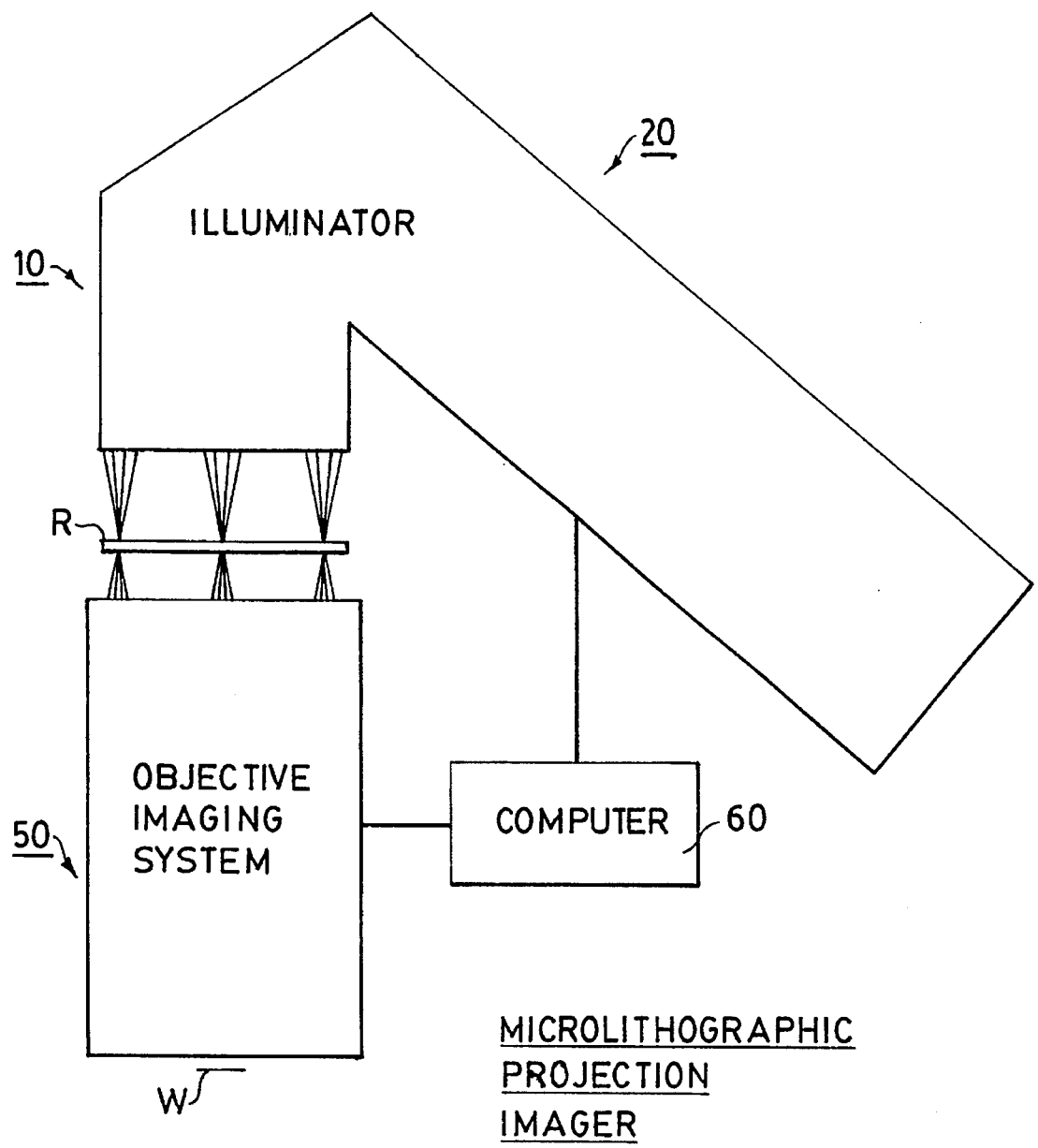
FIG. 1 is a schematic view of a microlithographic projection imager having an objective imaging system and an illuminator provided with the invention.

The environment in which the invention occurs is schematically illustrated by the microlithographic projection imager 10 of FIG. 1. This includes an illuminator 20 and an objective imaging system 50, preferably controlled by a computer 60. Light or radiation from a source not indicated is directed through an optical system of illuminator 20 (where the uniformity of the spatial intensity of the illumination is one of many considerations) to a reticle plane R where a mask or reticle to be imaged is positioned. Illumination passing through a mask at reticle plane R proceeds through objective imaging system 50 to wafer plane W, where the mask is imaged by the transmitted illumination. Uniformity of the spatial intensity of the illumination is highly desirable at wafer plane W so that a photo-resistive or photo-active surface on a wafer at wafer plane W is evenly exposed to the pattern of transmitted radiation throughout the illuminated area of the mask being imaged.

Figure 2:
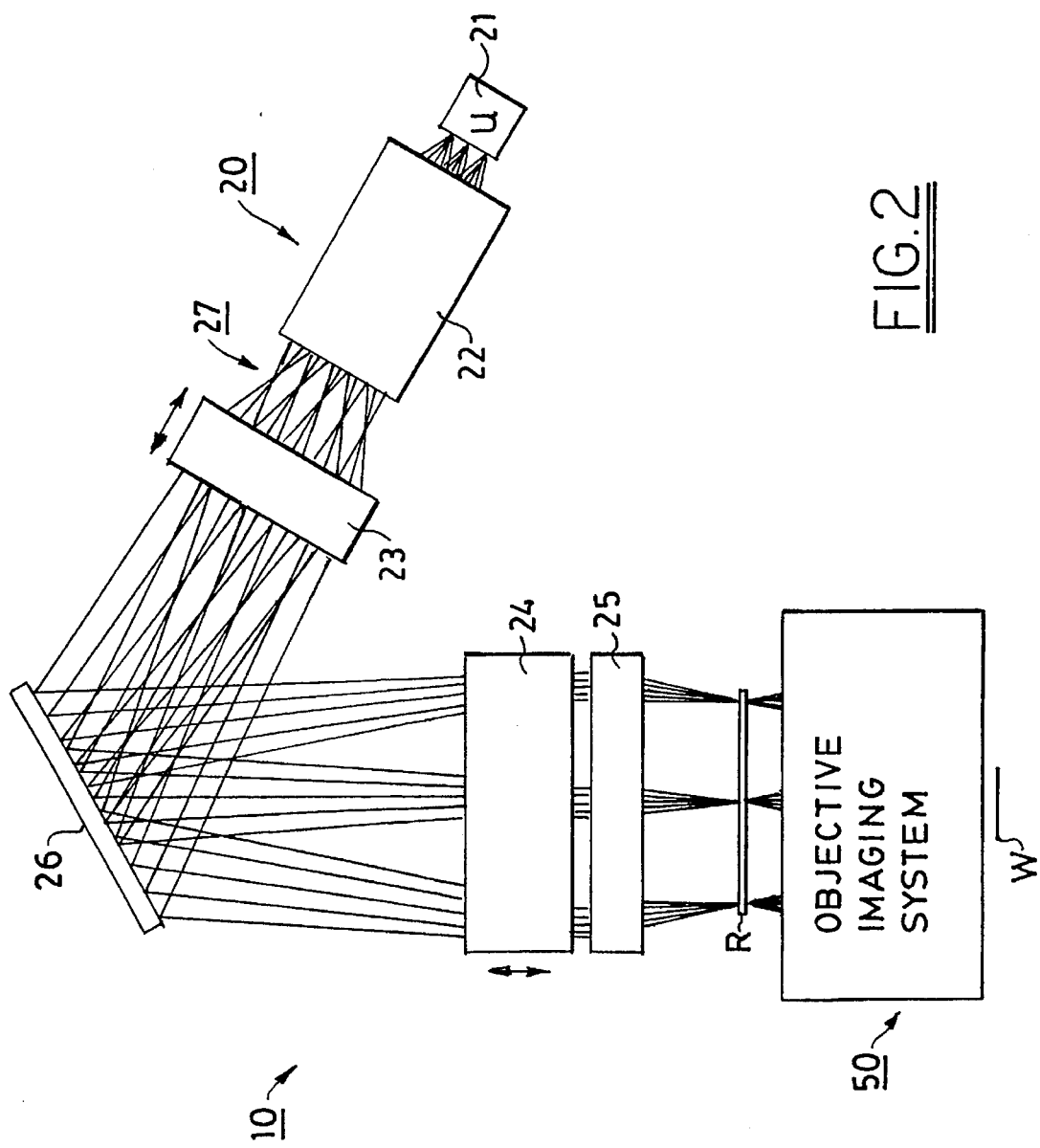
FIG. 2 is a schematic diagram of some of the members of the illuminator of FIG. 1 arranged according to the invention for varying the spatial intensity of the illumination provided to the objective imaging system.

A portion of illuminator 20 is schematically illustrated in more detail in FIG. 2, to show how the invention can be used to vary the spatial uniformity of illumination delivered to objective imaging system 50. Uniformizer 21 is the first component of illuminator 20 that is illustrated in FIG. 2, because upstream components such as a radiation source and lenses directing radiation to uniformizer 21 are generally known and are preferably not involved in the uniformity variation accomplished by the invention.

Uniformizer 21 can be a kaleidoscopic rod, a fly's eye lens, and possibly other devices that divide the illumination into a multitude of regions in a way that generally ensures uniform spatial intensity. This is well understood in illumination systems and need not be explained here.

Downstream of uniformizer 21 is a series of optical members 22–25, which can be single lens elements, composite lens elements, or groups of lens elements. These are preferably refractive and arranged on an optical axis of illuminator 20. Folding mirror 26 directs illumination from member 23 through the last two members 24 and 25 to reticle plane R.

Previous illumination systems have been designed to provide illumination at reticle plane R that is spatially uniform in its intensity, with the goal of making the illumination at wafer plane W also uniform in spatial intensity. The invention departs from this by making the spatial intensity of the illumination from illuminator 20 adjustable to compensate for factors causing deviation in the spatial uniformity of the intensity of the illumination.

The preferred way of doing this is by axially adjusting, as indicated by the arrows, uniformity member 23, which is next to and preferably downstream of pupil 27 of illuminator 20. Axial movement of member 23 preferably varies distortion of the illuminator optical system, which images a radiating plane in the illuminator. This imaging is different from the imaging of objective imaging system 50, which images a mask at reticle plane R onto a wafer at wafer plane W. The imaging accomplished by illuminator 20 preserves the spatial uniformity of the radiance of the imaged plane from uniformizer 21 so that the radiation arriving at wafer plane W is generally uniform in its spatial intensity. Axial adjustment of uniformity member 23, by varying the distortion of the imaging system of illuminator 20, can vary the spatial intensity of the illumination arriving at wafer plane W.

Uniformity member 23 can be a single lens, a lens group, or a composite lens. It is preferably next to the pupil region 27 of illuminator 20, rather than separated from pupil 27 by an intervening optical component. Uniformity member 23 is also preferably downstream of pupil 27, although arrangements of uniformity adjusting members upstream of pupil 27 are possible. Movement of uniformity member 23 can be made manually or by a motor controlled by computer 60. If adjusted under computer control, the position of uniformity member 23, for adjusting the spatial uniformity of the illumination, can be controlled from a keyboard of computer 60.

Moving uniformity member 23, to vary distortion of the optical system of illuminator 20, varies the uniformity of the illumination as shown in FIG. 3. One advantage of the distortion changes made by adjusting uniformity member 23 is that the effect on the spatial intensity of the illumination is rotationally symmetrical around the optical axis and varies the uniformity with distance from the optical axis at the wafer plane W. Since the factors that cause the illumination to deviate from uniformity tend to be rotationally symmetrical and to vary with distance from the optical axis at the wafer, uniformity member 23 is well suited to compensate for such deviation factors by varying the uniformity of the illumination in an opposite sense.

It often happens, for example, that factors making the illumination deviate from uniformity cause the center of the illumination to be hotter than the edge, which involves variation with distance from the optical axis. Adjustment of uniformity member 23 can compensate for this by varying the spatial intensity of the illumination upstream of wafer plane W to make the upstream illumination a little hotter at its edge than in its center. Then the uniformity deviation caused by the factors tending to cool the edge of the illumination will combine with the uniformity adjustment to make the illumination radially uniform at wafer plane W.

The graph of FIG. 3 shows the uniformity varying effect that can be imposed on the illumination by small shifts in the axial position of uniformity adjuster 23. The uniformity axis of the graph represents a percentage of positive or negative deviation from perfect uniformity at 0.000, based on the relationship $$u = 100 \times \left[ \frac{(i\max - i\min)}{(i\max + i\min)} \right]$$

where u is uniformity and i is intensity of illumination.

Adjustment of uniformity member 23, besides varying the spatial intensity of the illumination, can have other effects on the imaging system of illuminator 20. One of these is non-telecentric imaging of the illumination system (as distinct from the objective imaging system 50) at wafer plane W. This can be corrected by axial adjustment of another member 24 of illuminator optical system 20. Such a telecentricity correction, as indicated by the arrows in FIG. 2, can also be made either manually or under computer control. Another possible effect of a sufficiently large axial movement of uniformity member 23 is a departure from the predetermined magnification of the optical system of illuminator 20. This can be restored by another adjustment, preferably involving axial movement of members 22 and 23 together, so that they adjust axially by the same amount. As with uniformity member 23, telecentricity correcting member 24 can be a single lens, composite lens, or lens group; and member 22, which is movable with member 23 for restoring a predetermined magnification, can also be formed as a lens group. Any of these can be adjusted under control of computer 60.

I claim:

1. A microlithographic projection imager including an illuminator comprising:

a. an optical system of said illuminator being arranged for producing illumination intended to have uniform spatial intensity at a wafer plane of said imager;

b. said optical system of said illuminator having a uniformizer that forms a uniformly radiating plane of illumination, and an illumination imaging system that images the uniformly radiating plane to an objective imaging system arranged between a reticle plane and a wafer plane;

c. the illumination imaging system for imaging the uniformly radiating plane having a uniformity adjusting member that is movable for varying spatial intensity of the illumination to be nonuniform at the reticle plane to compensate for factors causing the spatial intensity of the illumination to deviate from uniformity at the wafer plane; and d. said uniformity adjusting member being arranged for varying distortion of the illumination imaging system of said illuminator.

2. The projection imager of claim 1 wherein said uniformity adjusting member is arranged next to a pupil of said illumination imaging system of said illuminator.

3. The projection imager of claim 1 wherein said uniformity adjusting member is refractive and movable axially of the illumination imaging system.

4. The projection imager of claim 1 wherein adjustment of said uniformity adjusting member can vary the intensity of said illumination to deviate from uniformity with distance from an optical axis of said illumination at a reticle plane of said imager.

5. The projection imager of claim 1 wherein said illumination imaging system of said illuminator includes a member adjustable for correcting non-telecentric imaging at said wafer plane caused by adjustment of said uniformity adjusting member.

6. The projection imager of claim 1 wherein said illumination imaging system of said illuminator includes a member for adjusting magnification altered by adjustment of said uniformity adjusting member.

7. A method of uniformly illuminating a wafer plane of a microlithographic projection imager having an illuminator with an optical system arranged for imaging at the wafer plane a uniformly radiating illuminator plane formed by a uniformizer, said method comprising:

a. determining whether illumination at said wafer plane deviates from uniform spatial intensity;

b. if deviation from said uniform spatial intensity occurs at the wafer plane, adjusting a uniformity member in an imaging portion of said optical system of said illuminator to vary spatial intensity of the imaging of the uniformly radiating plane from the uniformizer in a way that compensates for said deviation from uniform spatial intensity of said illumination at said wafer plane; and c. said adjusting of said uniformity member varying distortion of the imaging portion of said optical system of said illuminator.

8. The method of claim 7 wherein said adjusting includes moving said uniformity member axially of said optical system of said illuminator.

9. The method of claim 7 including adjusting said uniformity member so that said illumination provided by said illuminator varies in intensity with distance from an optical axis.

10. The method of claim 7 including adjusting another member of the imaging portion of said optical system of said illuminator to correct for non-telecentric imaging at said wafer plane caused by adjustment of said uniformity member.

11. The method of claim 7 including adjusting another member of the imaging portion of said optical system of said illuminator to restore a predetermined magnification that is varied by adjustment of said uniformity member.

12. In an illuminator for directing illumination to a microlithographic projection imager so that said illumination has uniform spatial intensity at a wafer plane of said imager, the improvement comprising:

a. an optical system of said illuminator for imaging at the wafer plane a uniformly radiating illuminator plane, the illuminator imaging system having an adjustable uniformity member for varying distortion of the imaging of the uniformly radiating plane;

b. variable distortion caused by adjusting said uniformity member being arranged for varying the uniformity of said spatial intensity of said illumination from the uniformly radiating plane so that the varied uniformity compensates for deviation from said uniform spatial intensity at said wafer plane; and c. said variable distortion being arranged for varying intensity of said illumination with distance from an optical axis.

13. The improvement of claim 12 wherein said uniformity member is refractive and movable axially of said optical system of said illuminator.

14. The improvement of claim 12 wherein said uniformity member is arranged next to a pupil of said optical system of said illuminator.

15. The improvement of claim 12 wherein said optical system of said illuminator includes a member that is movable to correct for non-telecentric imaging at said wafer plane caused by adjustment of said uniformity member.

16. The improvement of claim 12 wherein said optical system of said illuminator includes a member that is movable for restoring a predetermined magnification departed from by adjustment of said uniformity member.

17. A method of uniformly illuminating a wafer plane of a microlithographic projection imager having an illuminator with an optical system arranged for providing illumination having uniform spatial intensity at a reticle plane of said imager, said method comprising:

a. adjusting a uniformity member of said optical system of said illuminator to vary said spatial intensity of said illumination from uniformity at said reticle plane so that the diffractive effect of a mask arranged at said reticle plane is compensated by said uniformity variance to impose uniform spatial intensity on said illumination at said wafer plane; and b. said adjusting of said uniformity member varying distortion of an imaging portion of said optical system of said illuminator.

18. The method of claim 17 wherein said adjusting includes moving said uniformity member axially of said optical system of said illuminator.

19. The method of claim 17 including adjusting said uniformity member so that said illumination provided by said illuminator varies in intensity with distance from an optical axis.

20. The method of claim 17 including adjusting another member of said optical system of said illuminator to correct for non-telecentric imaging at said wafer plane caused by adjustment of said uniformity member.

21. The method of claim 17 including adjusting another member of said optical system of said illuminator to restore a predetermined magnification that is varied by adjustment of said uniformity member.

22. A microlithographic projection imager including an illuminator arranged for providing illumination with a uniform spatial intensity at reticle and wafer planes of an objective imaging system, said imager comprising:

a. a uniformity adjusting member of an optical system of said illuminator being arranged for varying said spatial intensity of said illumination from uniformity at said reticle plane to compensate for diffraction caused by a mask present at said reticle plane so that spatial intensity of said illumination is made uniform at said wafer plane when an illumination diffracting mask is present at said reticle plane; and b. said adjusting of said uniformity member varying distortion of an imaging portion of said optical system of said illuminator.

23. The imager of claim 22 wherein said adjusting includes moving said uniformity member axially of said optical system of said illuminator.

24. The imager of claim 22 including adjusting said uniformity member so that said illumination provided by said illuminator varies in intensity with distance from an optical axis.

25. The imager of claim 22 including adjusting another member of said optical system of said illuminator to correct for non-telecentric imaging at said wafer plane caused by adjustment of said uniformity member.

26. The imager of claim 22 including adjusting another member of said optical system of said illuminator to restore a predetermined magnification that is varied by adjustment of said uniformity member.

* * * * *